United States Patent
Sills et al.

(10) Patent No.: US 8,709,845 B2
(45) Date of Patent: Apr. 29, 2014

(54) SOLID STATE LIGHTING DEVICES WITH CELLULAR ARRAYS AND ASSOCIATED METHODS OF MANUFACTURING

(75) Inventors: Scott E. Sills, Boise, ID (US); Lifang Xu, Boise, ID (US); Scott D. Schellhammer, Meridian, ID (US); Thomas Gehrke, Boise, ID (US); Zaiyuan Ren, Boise, ID (US); Anton J. De Villiers, Boise, ID (US)

(73) Assignee: Micron Technology, Inc., Boise, ID (US)

(\*) Notice: Subject to any disclaimer, the term of this patent is extended or adjusted under 35 U.S.C. 154(b) by 0 days.

(21) Appl. No.: 13/612,484

(22) Filed: Sep. 12, 2012

(65) Prior Publication Data
US 2013/0005065 A1    Jan. 3, 2013

Related U.S. Application Data (62) Division of application No. 12/731,923, filed on Mar. 25, 2010, now Pat. No. 8,390,010.

(51) Int. Cl.
*H01L 21/00* (2006.01)

(52) U.S. Cl.
USPC .......... 438/29; 438/34; 438/40; 257/E33.006

(58) Field of Classification Search
CPC ..................................... H01L 33/24
USPC ............ 438/29, 34, 42, 43, 44, 46, 47; 257/E33.006, E33.067, E33.068, 257/E33.074
See application file for complete search history.

(56) References Cited

U.S. PATENT DOCUMENTS

| | | | |
|---|---|---|---|
| 6,576,932 B2 | 6/2003 | Khare et al. | |
| 7,012,281 B2 | 3/2006 | Tsai et al. | |
| 7,030,421 B2 | 4/2006 | Okuyama et al. | |
| 7,427,772 B2 | 9/2008 | Chuo et al. | |
| 7,476,909 B2 | 1/2009 | Nagai et al. | |
| 7,482,189 B2 * | 1/2009 | Lee et al. | 438/40 |
| 7,598,105 B2 | 10/2009 | Lee et al. | |
| 8,134,163 B2 | 3/2012 | Yu et al. | |
| 2005/0145862 A1 * | 7/2005 | Kim et al. | 257/91 |
| 2006/0094244 A1 | 5/2006 | Yamada et al. | |
| 2008/0277682 A1 | 11/2008 | Mishra et al. | |
| 2009/0008654 A1 | 1/2009 | Nagai | |
| 2009/0186435 A1 | 7/2009 | Yeh et al. | |
| 2009/0189172 A1 | 7/2009 | Pan et al. | |

(Continued)

OTHER PUBLICATIONS

Feezell, D.F. et al., Development of Nonpolar and Semipolar InGaN/GaN Visible Light-Emitting Diodes, MRS Bulletin, vol. 34, pp. 318-323, May 2009.

(Continued)

*Primary Examiner* — William F Kraig
*Assistant Examiner* — Pavel Ivanov
(74) *Attorney, Agent, or Firm* — Perkins Coie LLP (57) ABSTRACT

Solid state lighting ("SSL") devices with cellular arrays and associated methods of manufacturing are disclosed herein. In one embodiment, a light emitting diode includes a semiconductor material having a first surface and a second surface opposite the first surface. The semiconductor material has an aperture extending into the semiconductor material from the first surface. The light emitting diode also includes an active region in direct contact with the semiconductor material, and at least a portion of the active region is in the aperture of the semiconductor material.

18 Claims, 10 Drawing Sheets

(56) References Cited

U.S. PATENT DOCUMENTS

| | | |
|---|---|---|
| 2009/0286346 A1 | 11/2009 | Adkisson et al. |
| 2009/0315013 A1 | 12/2009 | Tansu et al. |
| 2011/0193115 A1 | 8/2011 | Schellhammer et al. |
| 2011/0233581 A1 | 9/2011 | Sills et al. |

OTHER PUBLICATIONS

Zhang, X. et al., Enhancement of LED light extraction via diffraction of hexagonal lattice fabricated in ITO layer with holographic lithography and wet etching, Physics Letters A, vol. 372, Issue 20, pp. 3738-3740, May 12, 2008.

* cited by examiner

SOLID STATE LIGHTING DEVICES WITH CELLULAR ARRAYS AND ASSOCIATED METHODS OF MANUFACTURING

CROSS-REFERENCE TO RELATED APPLICATION

This application is a divisional of U.S. application Ser. No. 12/731,923 filed Mar. 25, 2010, which is incorporated herein by reference in its entirety.

TECHNICAL FIELD

The present technology is directed generally to solid state lighting ("SSL") devices with cellular arrays and associated methods of manufacturing.

BACKGROUND

Figure 1:
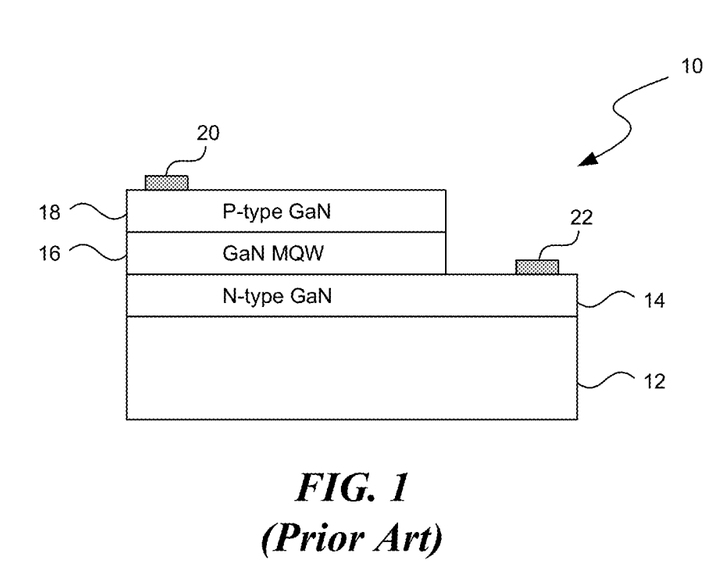
FIG. 1 is a cross-sectional view of a portion of an LED in accordance with the prior art.

SSL devices generally use semiconductor light emitting diodes ("LEDs"), organic light-emitting diodes ("OLEDs"), and/or polymer light emitting diodes ("PLEDs") as sources of illumination rather than electrical filaments, a plasma, or a gas. FIG. 1 is a cross-sectional diagram of a portion of a conventional indium-gallium nitride ("InGaN") LED 10. As shown in FIG. 1, the LED 10 includes a substrate 12 (e.g., silicon carbide, sapphire, gallium nitride, or silicon), an N-type gallium nitride ("GaN") material 14, an InGaN/GaN multiple quantum wells ("MQWs") 16, and a P-type GaN material 18 layered on one another in series. The LED 10 also includes a first contact 20 on the P-type GaN material 18 and a second contact 22 on the N-type GaN material 14.

According to conventional techniques, the N-type and/or P-type GaN materials 14 and 18 are typically formed as planar structures via epitaxial growth. The planar structures have limited surface areas and thus can limit the number of MQWs formed thereon. As a result, the LED 10 may have limited emission power output per unit surface area. Accordingly, several improvements to increase the emission output for a particular surface area of an LED may be desirable.

DETAILED DESCRIPTION

Various embodiments of SSL devices and associated methods of manufacturing are described below. The term "microelectronic substrate" is used throughout to include substrates upon which and/or in which SSL devices, microelectronic devices, micromechanical devices, data storage elements, read/write components, and other features are fabricated. A person skilled in the relevant art will also understand that the technology may have additional embodiments, and that the technology may be practiced without several of the details of the embodiments described below with reference to FIGS. 2A-3H.

In the following discussion, an LED having GaN/InGaN materials is used as an example of an SSL device in accordance with embodiments of the technology. Several embodiments of the SSL device may also include at least one of gallium arsenide (GaAs), aluminum gallium arsenide (AlGaAs), gallium arsenide phosphide (GaAsP), aluminum gallium indium phosphide (AlGaInP), gallium(III) phosphide (GaP), zinc selenide (ZnSe), boron nitride (BN), aluminum nitride (AlN), aluminum gallium nitride (AlGaN), aluminum gallium indium nitride (AlGaInN), and/or other suitable semiconductor materials.

Figure 2A:
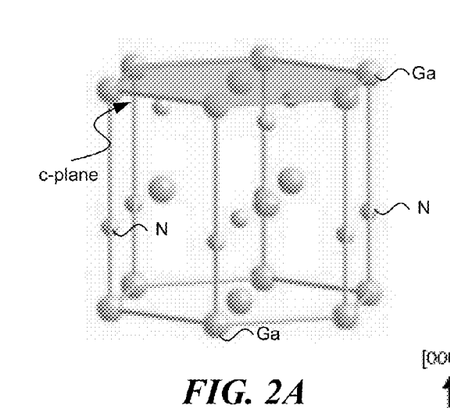
FIGS. 2A-2F are schematic perspective views of various crystal planes in a GaN/InGaN material in accordance with embodiments of the technology.
Figures 2B, 2C:
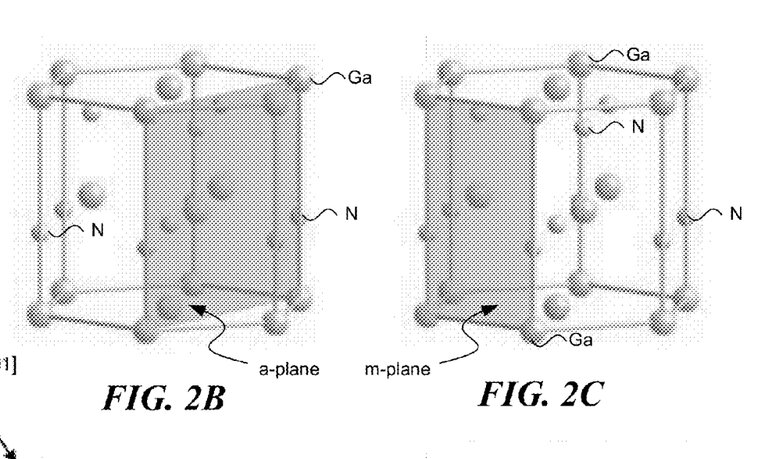
Figure 2D:
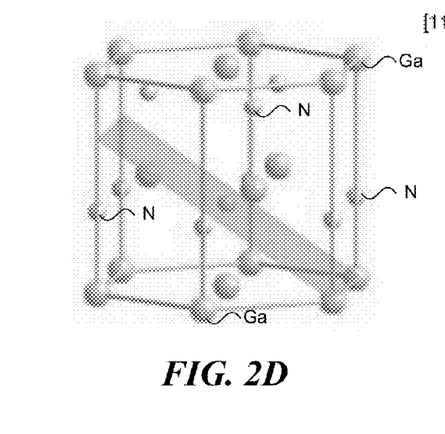
Figure 2E:
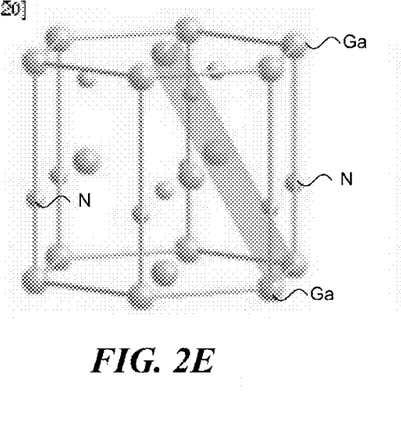
Figure 2F:
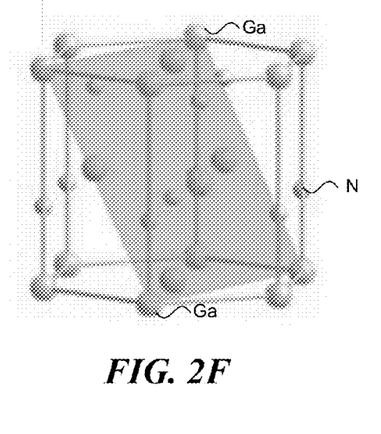

FIGS. 2A-2F are schematic perspective views of various crystal planes in a portion of a GaN/InGaN material. In FIGS. 2A-2F, Ga (or Ga/In) and N atoms are schematically shown as large and small spheres, respectively. As shown in FIGS. 2A-2F, the GaN/InGaN material has a wurtzite crystal structure with various lattice planes or facets as represented by corresponding Miller indices. A discussion of the Miller index can be found in the *Handbook of Semiconductor Silicon Technology* by William C. O'Mara. For example, as shown in FIG. 2A, the plane denoted as the "c-plane" in the wurtzite crystal structure with a Miller index of (0001) contains only Ga atoms. Similarly, other planes in the wurtzite crystal structure may contain only N atoms and/or other suitable types of atoms. In another example, the wurtzite crystal structure also includes crystal planes that are generally perpendicular to the c-plane. FIG. 2B shows a plane denoted as the "a-plane" in the wurtzite crystal structure with a Miller index of (11$\bar{2}$0). FIG. 2C shows another plane denoted as the "m-plane" in the wurtzite crystal structure with a Miller index of (10$\bar{1}$0). In a further example, the wurtzite crystal structure can also include crystal planes that are canted relative to the c-plane without being perpendicular thereto. As shown in FIGS. 2D-2F, each of the planes with Miller indices of (10$\bar{1}$3) (10$\bar{1}$1), and (11$\bar{2}$2) form an angle with the c-plane shown in FIG. 2A. The angle is greater than 0° but less than 90°. Even though only particular examples of crystal planes are illustrated in FIGS. 2A-2F, the wurtzite crystal structure can also include other crystal planes not illustrated in FIGS. 2A-2F.

Figure 3A:
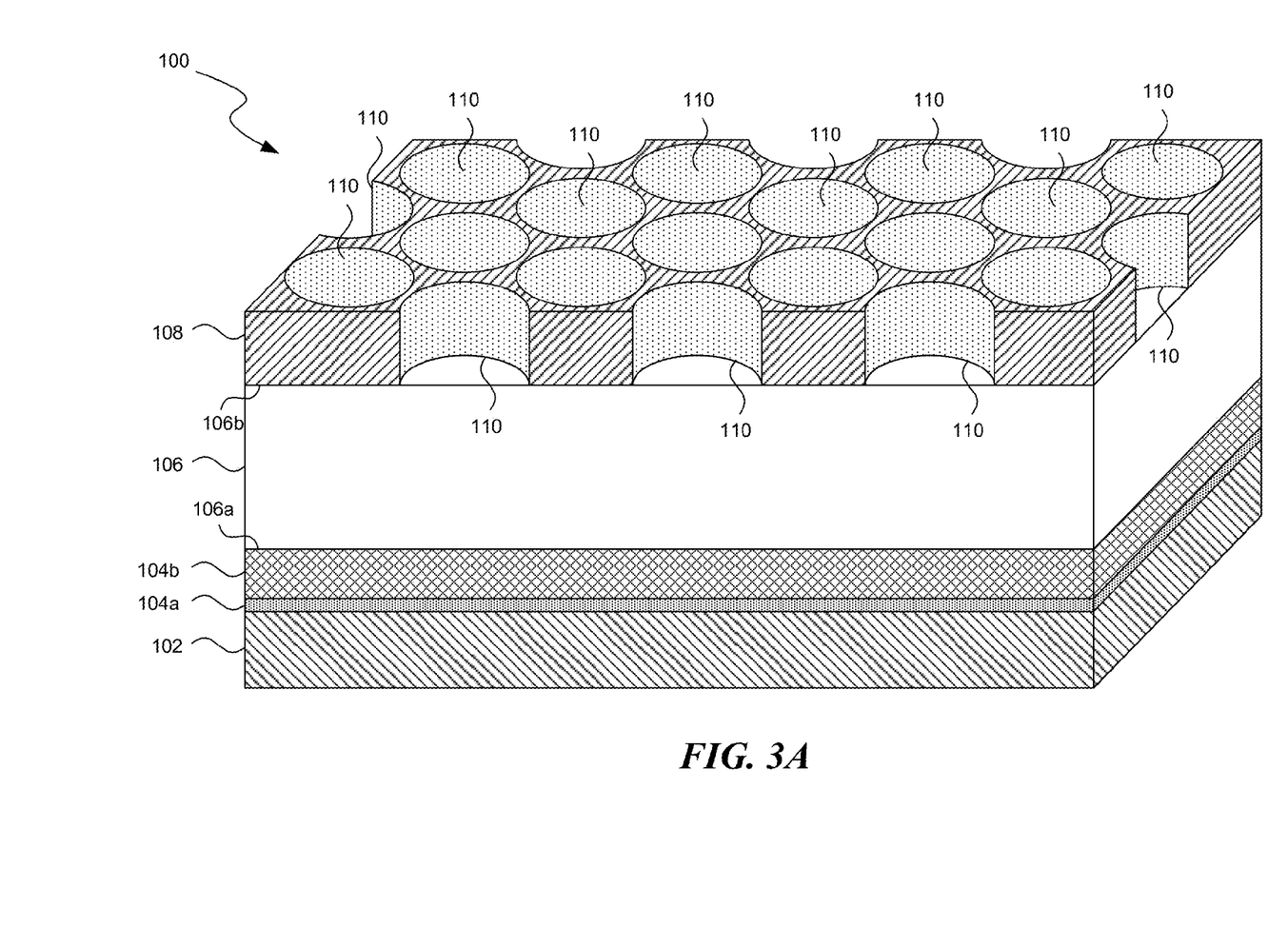
FIGS. 3A-3H are partially cutaway and perspective views of a portion of a semiconductor device undergoing a process to form an SSL device in accordance with embodiments of the technology.

FIG. 3A is a partially cutaway and perspective view of a portion of a semiconductor device 100 undergoing a process in accordance with embodiments of the technology. As shown in FIG. 3A, an initial stage of the process includes forming one or more optional first and second buffering materials 104a and 104b and a first semiconductor material 106 on a microelectronic substrate 102 in series. The microelectronic substrate 102 can include a substrate material upon which the first and second buffering layers 104a and 104b and the first semiconductor material 106 can be readily formed. For example, in one embodiment, the microelectronic substrate 102 includes silicon (Si) with a lattice orientation of {1,1,1}. In other embodiments, the microelectronic substrate 102 can include gallium nitride (GaN), aluminum nitride (AlN), and/or other suitable semiconductor materials. In further embodiments, the microelectronic substrate 102 can include diamond, glass, quartz, silicon carbide (SiC), aluminum oxide ($Al_2O_3$), and/or other suitable crystalline and/or ceramic materials.

The optional first and second buffer materials 104a and 104b may facilitate formation of the first semiconductor material 106 on the microelectronic substrate 102. In certain embodiments, the first and second buffer materials 104a and 104b can include aluminum nitride (AlN) and aluminum gallium nitride (AlGaN), respectively. In other embodiments, the first and second buffer materials 104a and 104b can also include aluminum oxide ($Al_2O_3$), zinc nitride ($Zn_3N_2$), and/ or other suitable buffer materials. In further embodiments, at least one of the first and second buffer materials 104a and 104b may be omitted.

In the illustrated embodiment, the first semiconductor material 106 can include an N-type GaN material formed on the optional second buffer material 104b. The first semiconductor material 106 has a first surface 106a in direct contact with the second buffer material 104b and a second surface 106b opposite the first surface 106a. In other embodiments, the first semiconductor material 106 can also include a P-type GaN material and/or other suitable semiconductor materials. In any of the foregoing embodiments, the first and second buffer materials 104a and 104b and the first semiconductor material 106 may be formed on the microelectronic substrate 102 via metal organic CVD ("MOCVD"), molecular beam epitaxy ("MBE"), liquid phase epitaxy ("LPE"), hydride vapor phase epitaxy ("HVPE"), and/or other suitable techniques.

As shown in FIG. 3A, another stage of the process can include depositing and patterning a mask material 108 on the first semiconductor material 106 to form at least one aperture 110 in the mask material 108. In the illustrated embodiment, the apertures 110 each include generally cylindrical openings extending substantially through the entire depth of the mask material 108 and exposing a portion of the second surface 106b of the first semiconductor material 106. In other embodiments, the apertures 110 may also include openings with hexagonal, pentagonal, oval, rectilinear, square, triangular, and/or other suitable cross sections that extend at least partially into the mask material 108. In further embodiments, the apertures 110 may have openings with a combination of different cross sections that extend to different depths in the mask material 108.

In certain embodiments, the mask material 108 can include a photoresist deposited on the first semiconductor material 106 via spin coating and/or other suitable techniques. The deposited photoresist may then be patterned via photolithography. In other embodiments, the mask material 108 may also include silicon oxide (SiO2), silicon nitride (SiN), and/or other suitable masking materials formed on the first semiconductor material 106 via chemical vapor deposition ("CVD"), atomic layer deposition ("ALD"), and/or other suitable techniques. In such embodiments, the deposited masking materials may then be patterned with a photoresist (not shown) via photolithography and subsequently etched (e.g., dry etching, wet etching, etc.) to form the apertures 110.

Figure 3B:
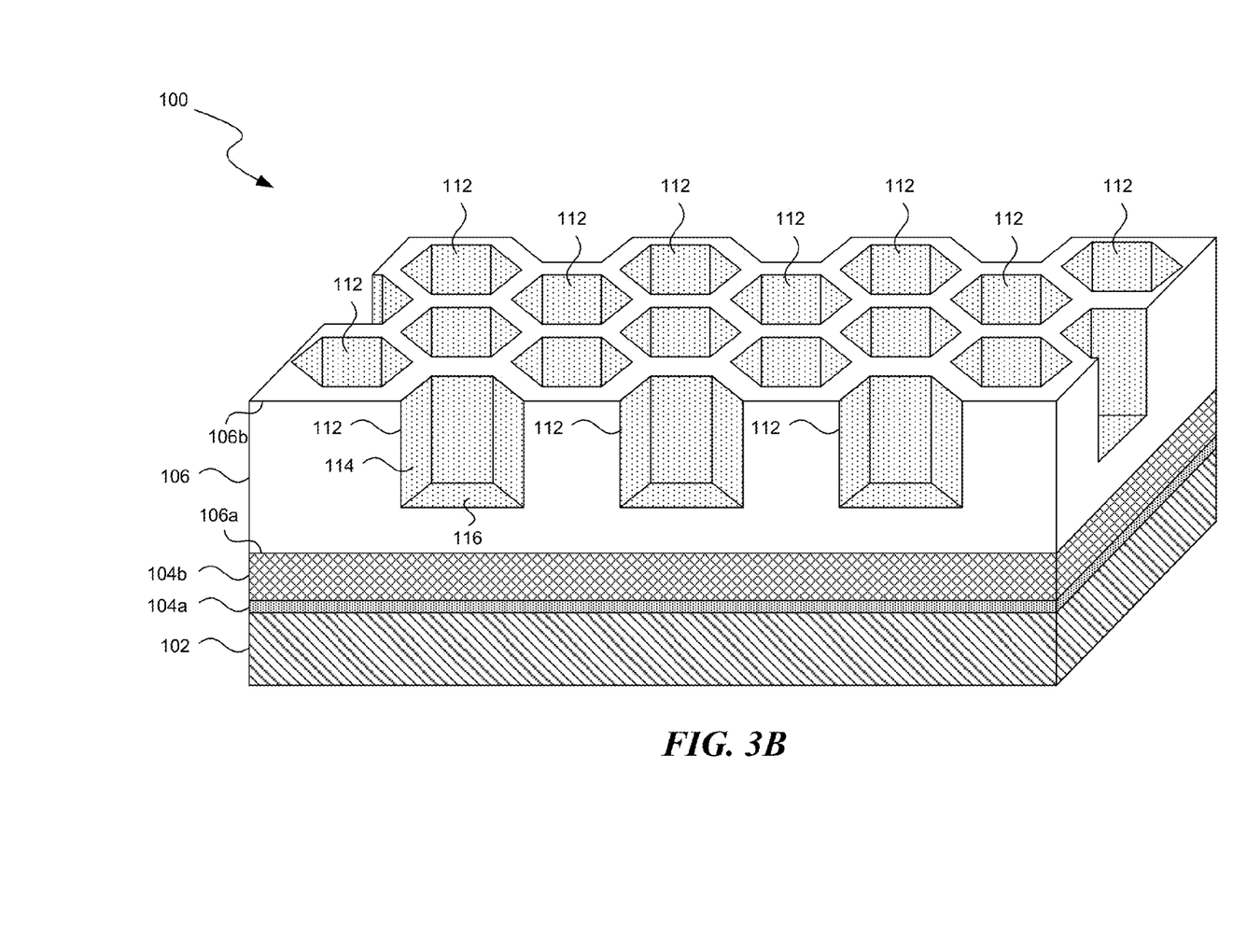
Figure 3C:
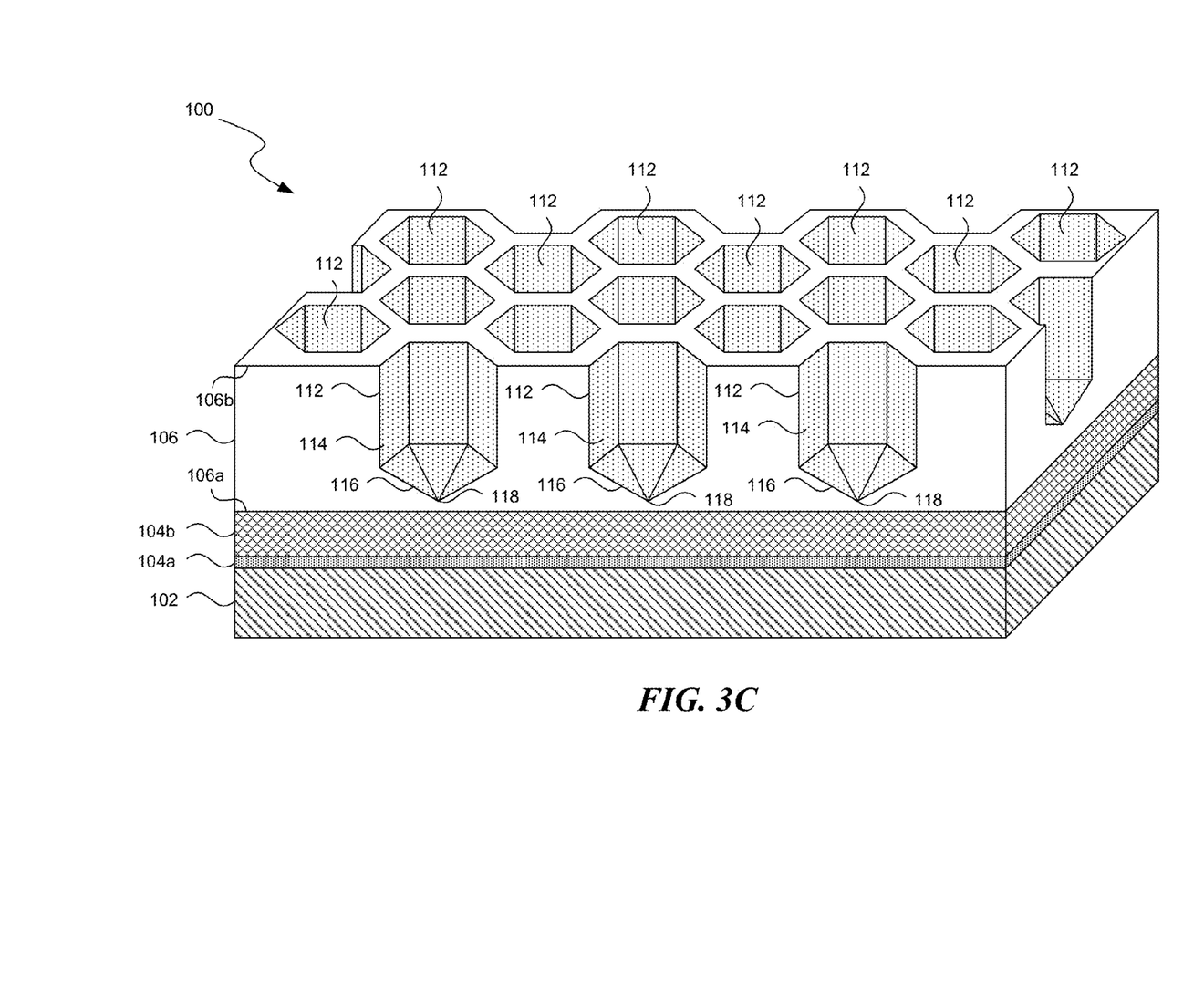

FIGS. 3B and 3C show embodiments of another stage of the process in which at least one well 112 is formed in the first semiconductor material 106. The wells 112 can individually correspond to the apertures 110 (FIG. 3A) in the mask material 108 (FIG. 3A). As shown in FIG. 3B, the wells 112 individually include a generally hexagonal cross section with six sidewalls 114 extending from the second surface 106b toward the first surface 106a of the first semiconductor material 106. The sidewalls 114 of the individual wells 112 are joined at a generally planar base 116 at a depth within the semiconductor material 106 intermediate to the first and second surfaces 106a and 106b. In other embodiments, at least one of the wells 112 may include sidewalls 114 that extend the entire length between the first and second surfaces 106a and 106b of the first semiconductor material 106. In further embodiments, the base 116 may not be planar, as described in more detail below with reference to FIG. 3C.

The wells 112 may be formed via an isotropic, an anisotropic, or a combination of both isotropic and anisotropic etching operations. For example, in certain embodiments, forming the wells 112 includes isotropically etching and subsequently anisotropically etching the first semiconductor material 106 via the apertures 110 of the mask material 108 (FIG. 3A.) The isotropic etching may include contacting the first semiconductor material 106 with phosphoric acid ($H_3PO_4$), sodium hydroxide (NaOH), potassium hydroxide (KOH), and/or other suitable etchants. The anisotropic etching may include plasma etching, reactive ionic etching, and/or other suitable dry etching techniques. After forming the wells 112, the mask material 108 may be removed via wet etching, laser ablation, and/or other suitable techniques.

Without being bound by theory, it is believed that by utilizing wet etching the hexagonal-shaped cross sections of the wells 112 may result using the cylindrical apertures 110 in the mask material (FIG. 3A) because phosphoric acid and/or other anisotropic etchants can remove material at different rates along different crystal planes of the first semiconductor material 106 under select etching conditions. For example, it is believed that phosphoric acid and/or other anisotropic etchants can remove GaN material from c-plane, a-plane, and/or m-plane faster than other planes (e.g., those shown in FIGS. 2D-2F) due, at least in part, to the different bonding energy of gallium (Ga) and/or nitrogen (N) atoms in these planes. As a result, phosphoric acid and/or other anisotropic etchants can preferentially remove materials from these crystal planes to form the hexagonal cross sections of the wells 112.

It is also believed that etching conditions (e.g., etching temperature, etching time, concentration and/or composition of etchant) may be adjusted to achieve different configurations for the sidewalls 114. For example, the sidewalls 114 may be formed along the same crystal planes (e.g., m-plane) based on a first set of select etching conditions. In other examples, the sidewalls 114 may be formed at different crystal planes based on a second set of select etching conditions. At least some of the sidewalls 114 may be formed at an angle that is slanted compared to the base 116. In further examples, the sidewalls 114 may converge into an apex (not shown) so that the individual wells 112 have an inverted hexagonal pyramid shape based on a third set of select etching conditions.

Even though the base 116 is shown as generally planar in FIG. 3B, in certain embodiments, the base 116 may be non-planar. For example, as shown in FIG. 3C, the wells 112 may individually include a base 116 with an inverted hexagonal pyramid shape converging at an apex 118. Techniques for forming the sidewalls 114 and the non-planar base 116 can include removing material from the first semiconductor material 106 via (1) only isotropic etching, (2) anisotropic etching to expose desired crystal planes for the sidewalls 114 and subsequent isotropic etching to form the non-planar base 116, or (3) other suitable techniques.

Figure 3D:
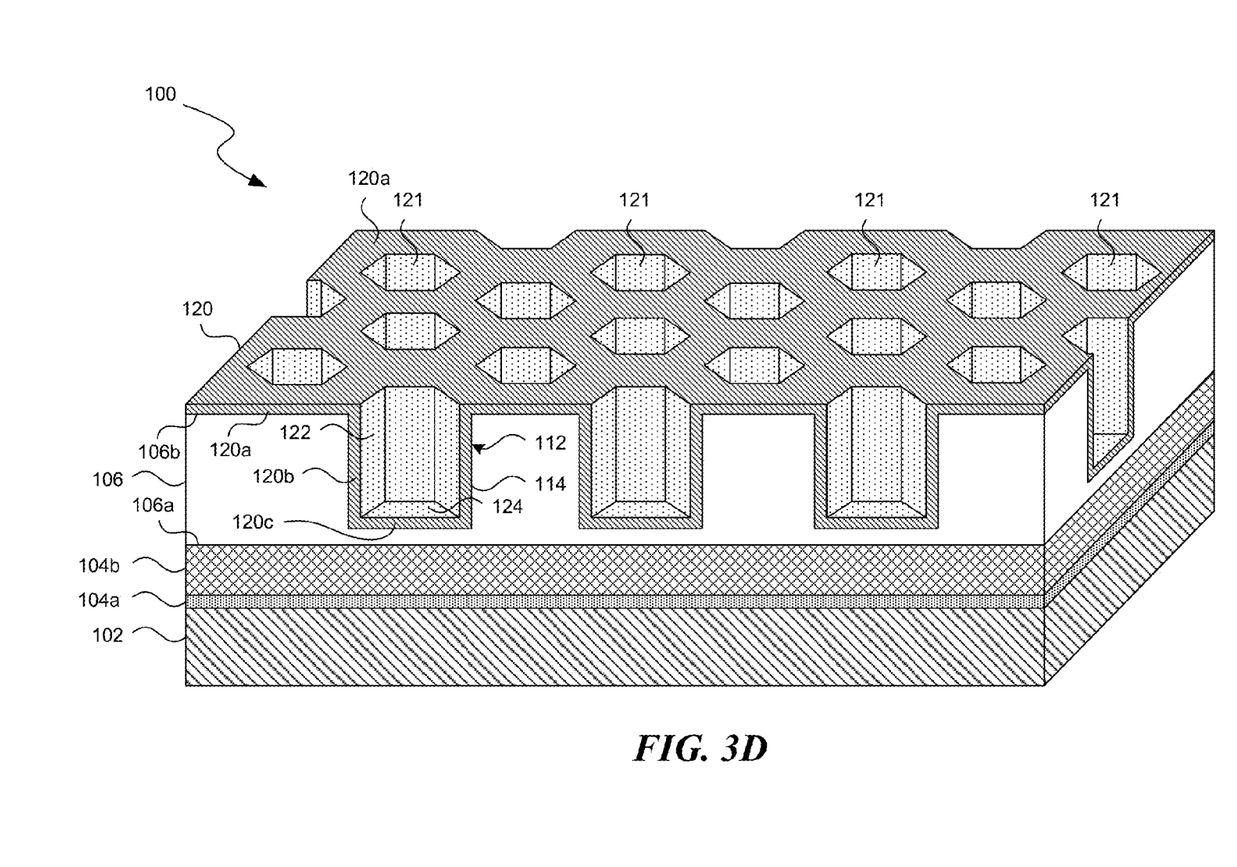

FIG. 3D shows another stage of the process in which an active region 120 of an LED device is formed in the semiconductor device 100. In the following description, the embodiment of the semiconductor device 100 shown in FIG. 3B is used to describe subsequent processing operations for illustration purposes. One of ordinary skill in the art will understand that the described operations, structures, and/or functions may equally apply to the embodiments shown in FIG. 3C and/or other embodiments of the semiconductor device 100. In the illustrated embodiment, the active region 120 includes InGaN/GaN MQWs. In other embodiments, the active region 120 may include other suitable semiconductor materials.

As shown in FIG. 3D, the active region 120 may include a first active portion 120a formed on the second surface 106b of the first semiconductor material 106, a second active portion 120b formed on the sidewalls 114, and a third active portion 120c on the bases 116 of the wells 112. In certain embodiments, the active region 120 may generally conform to the second surface 106b of the first semiconductor material 106. As a result, the first, second, and third portions 120a, 120b, and 120c of the active region 120 may have a generally constant thickness (and/or number of MQWs).

In other embodiments, the first, second, and third portions 120a, 120b, and 120c of the active region 120 may have different thicknesses by forming the active region 120 at different rates on the different underlying surfaces of the first semiconductor material 106. For example, the sidewalls 114 of the wells 112 may be selected to form at crystal planes upon which the active region 120 may readily nucleate. Thus, the second active portion 120b of the active region 120 may have a thickness that is greater than that of the first active portion 120a on the second surface 106b of the first semiconductor material 106 and/or the third active portion 120c on the bases 116 of the wells 112.

In further embodiments, parts of the second active portion 120b may have different thicknesses than other parts of the second active portion 120b. As a result, different parts of the second active portion 120b may have different indium (In) incorporation rates. For example, the active region 120 of two adjacent sidewalls 114 of a particular well 112 may have different thicknesses because the adjacent sidewalls 114 have been formed on different crystal planes. In other examples, some sidewalls 114 (e.g., two opposing sidewalls) of a particular well 112 may have the same thickness while other sidewalls 114 (e.g., two adjacent sidewalls) of the well 112 may have different thicknesses, and thus different thicknesses of MQWs. It is believed that different indium (In) incorporation and/or different thicknesses of the MQWs can influence the wavelengths and/or other optical properties of the MQWs.

Without being bound by theory, it is believed that the emission characteristics of the semiconductor device 100 are related to or at least influenced by the MQW density in the active region 120. Accordingly, several characteristics of the semiconductor device 100 may be adjusted to achieve desired emission wavelengths, colors, and/or other emission characteristics of the semiconductor device 100. For example, one may increase the pattern density (e.g., by reducing the pitch to about 50 µm to about 500 nm) of the apertures 110 (FIG. 3A) and of corresponding wells 112 to increase the interfacial areas upon which MQWs of varying optical properties may be formed. In another example, one may also increase the depth and/or aspect ratio of the wells 112 (e.g., with an aspect ratio of about 40:1) to increase the interfacial areas of the sidewalls 114. In a further example, one may also adjust the configuration of the sidewalls 114 (e.g., crystal planes) of the individual wells 112 such that the active region 120 may form with a desired number and optical properties of MQWs. In yet further examples, one may adjust a combination of at least some of the foregoing characteristics and/or other suitable characteristics of the semiconductor device 100.

Figure 3E:
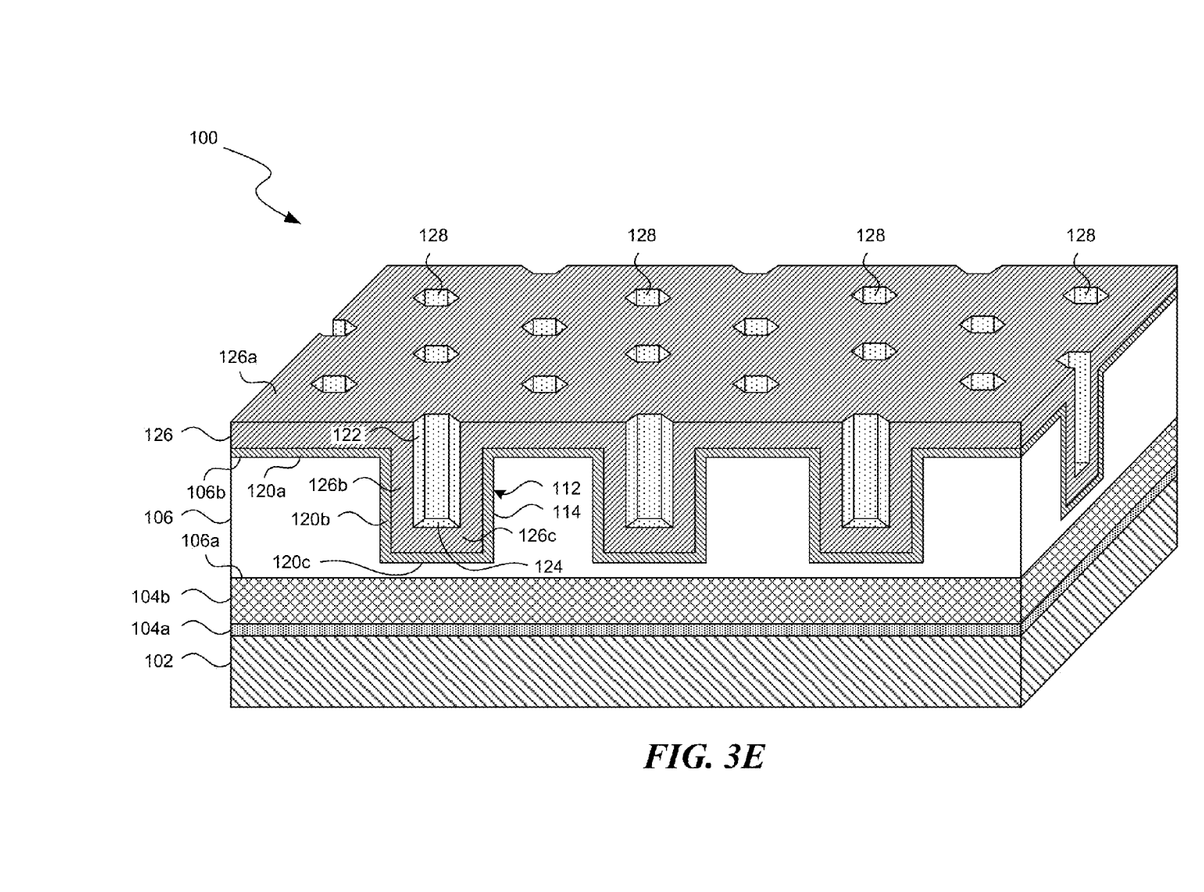

FIG. 3E shows another stage of the process in which a second semiconductor material 126 is formed on the active region 120. In the illustrated embodiment, the second semiconductor material 126 includes a P-type GaN material. In other embodiments, the second semiconductor material 126 may include an N-type GaN material and/or other suitable semiconductor materials.

As shown in FIG. 3E, the second semiconductor material 126 includes first, second, and third semiconductor portions 126a, 126b, and 126c generally corresponding to the first, second, and third active portions 120a, 120b, and 120c of the active region 120. As a result, the second semiconductor material 126 includes a plurality of openings 128 individually extending into the wells 112. In other embodiments, the second semiconductor material 126 may completely fill the wells 112 to create a generally planar surface (not shown) spaced apart from the active region 120. For any of the foregoing embodiments, techniques for forming the first semiconductor material 106, the active region 120, and the second semiconductor material 126 can include MOCVD, MBE, LPE, and/or other suitable techniques.

Figure 3F:
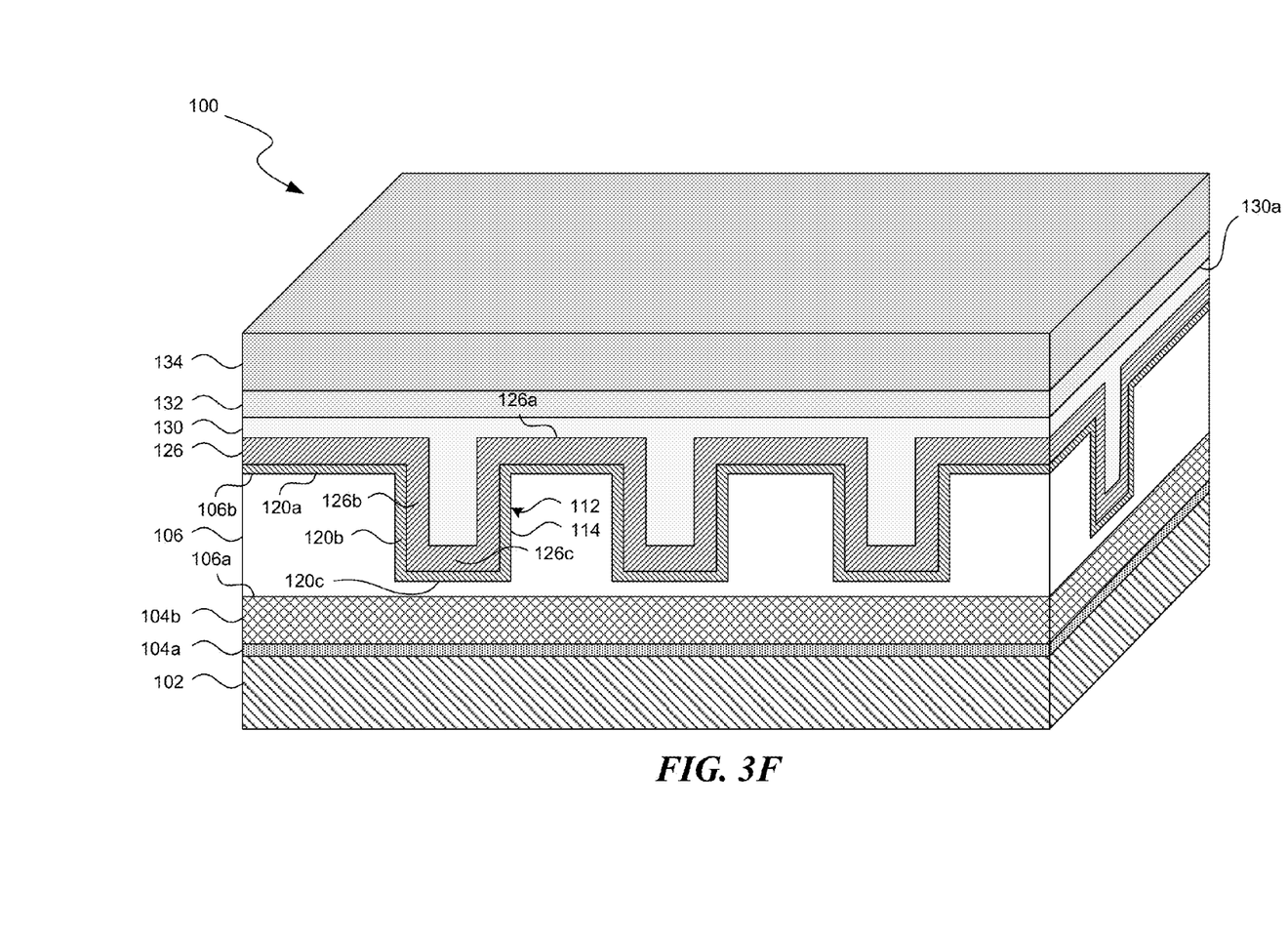

FIG. 3F shows another stage of the process in which an electrode material 130, a reflective material 132, and a diffusion barrier 134 are formed on the semiconductor device 100 in series. The electrode material 130 substantially fills the wells 112 and has a generally planar electrode surface 130a proximate to the reflective material 132. The electrode material 130 can include indium tin oxide (ITO), fluorine-doped tin oxide (FTO), zinc oxide (ZnO), and/or other suitable transparent conducting oxides ("TCOs"). The reflective material 132 can include silver (Ag), aluminum (Al), and/or other suitable light reflective materials. The diffusion barrier 134 can include silicon carbide (SiC), silicon oxide ($SiO_2$), and/or other suitable insulating materials. Techniques for forming the electrode material 130, the reflective material 132, and the diffusion barrier 134 may include PVD, CVD, ALD, spin coating, and/or other suitable techniques.

Figure 3G:
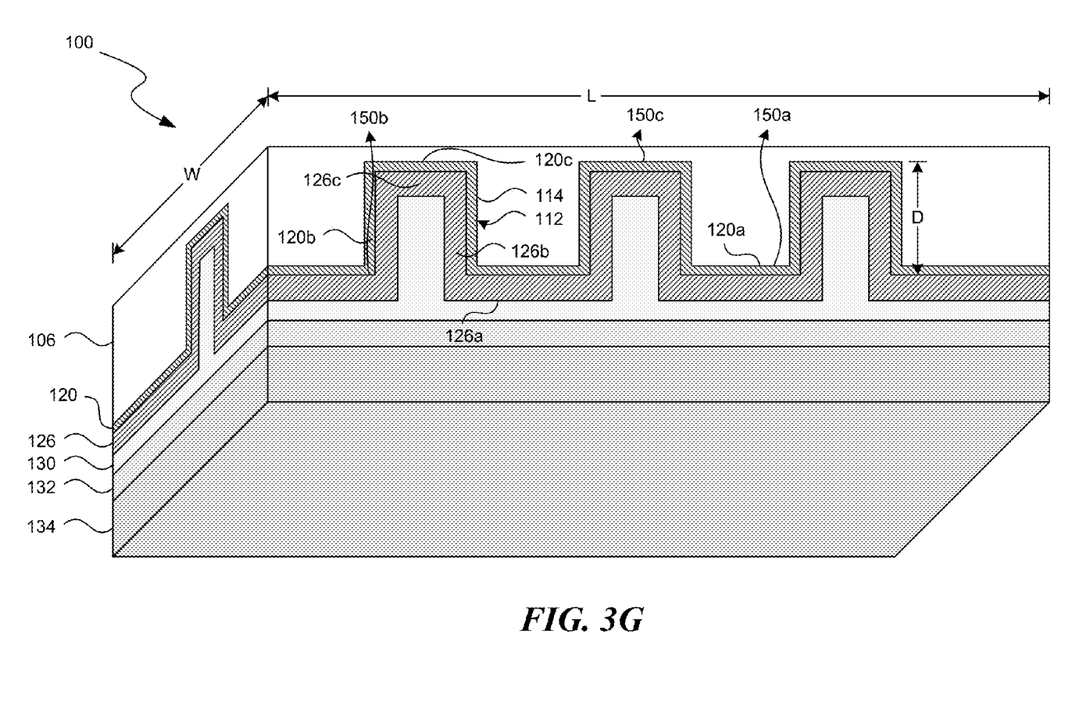

FIG. 3G shows another stage of the process in which the microelectronic substrate 102 and the optional first and second buffering materials 104a and 104b are removed from the semiconductor device 100. In FIG. 3G, the semiconductor device 100 is shown inverted related to FIG. 3E for illustrating a suitable processing orientation. Techniques for removing these materials can include back grinding, wet etching, dry etching, laser ablation, and/or other suitable techniques.

Figure 3H:
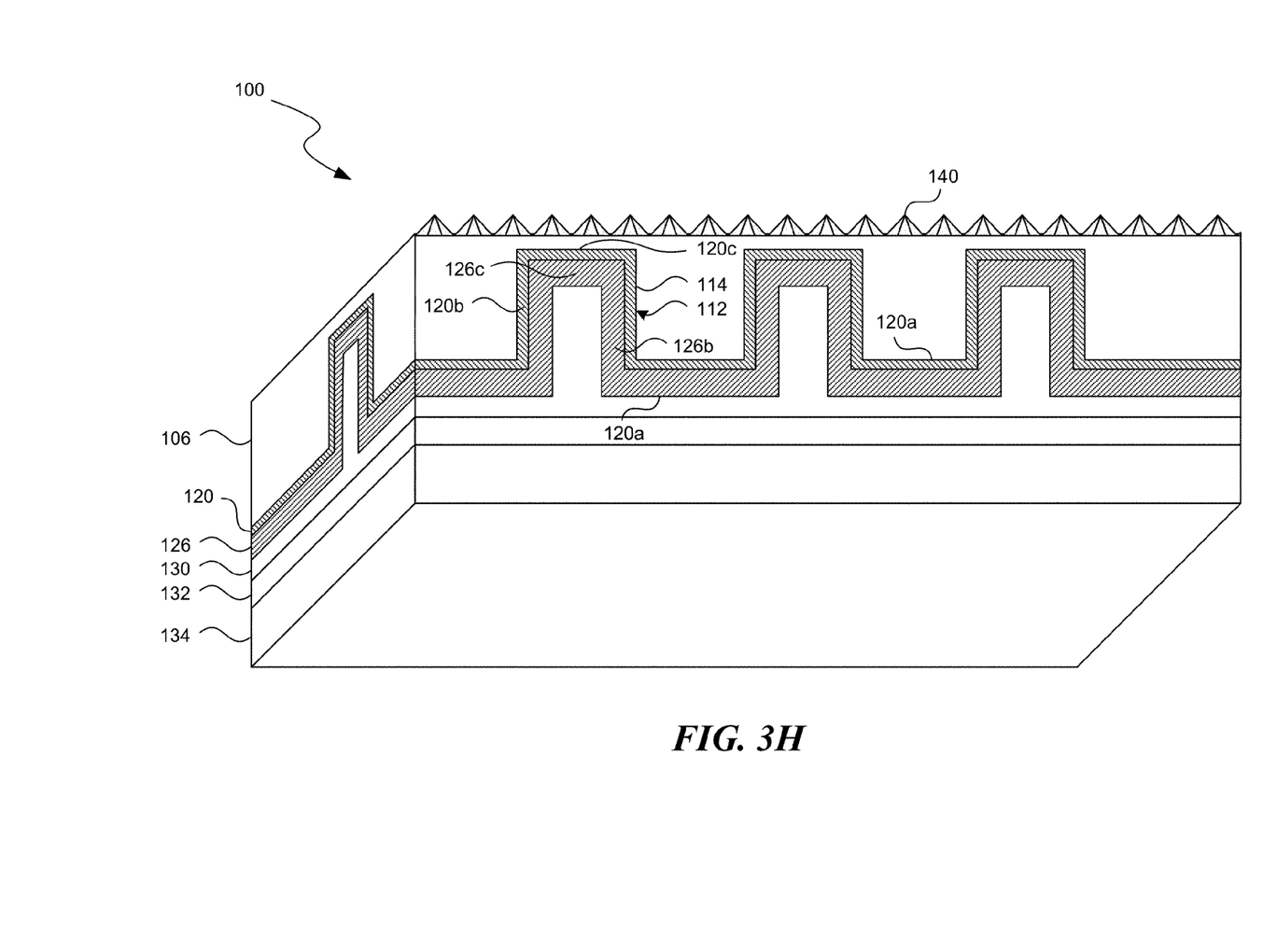

FIG. 3H shows an optional stage of the process in which a plurality of light extraction features 140 are formed on the first semiconductor material 106. In the illustrated embodiment, the light extraction features 140 includes a plurality of hexagonal pyramids formed via wet etching (e.g., with phosphoric acid) the first semiconductor material 106. In other embodiments, the light extraction features 140 may include other suitable structures. In further embodiments, the light extraction features 140 may be omitted.

In operation, the active region 120 may generate emissions when an excitation voltage is applied via the first and second semiconductor materials 106 and 126. As shown in FIG. 3G, the first, second, and third portions 120a, 120b, and 120c of the active region 120 can individually generate corresponding first, second, and third emission portions 150a, 150b, and 150c. As a result, several embodiments of the semiconductor device 100 can generate more emissions (e.g., from the second portion 120b of the active region 120) when compared to others planar LEDs, which can only emit from planar portions corresponding to the first and third portions 120a and 120c of the active region 120.

Without being bound by theory, it is believed that embodiments of the first and second semiconductor materials 106 and 126 may form optical guides for light generated by the active region 120 during operation. It is believed that the differences in refractive indices between the first and second semiconductor materials 106 and 126 and the active region 120 may reduce the amount of internal reflection in the wells 112. As a result, the first and second semiconductor materials 106 and 126 may "guide" an increased amount of light generated by the active region 120 to outwardly toward an illumination target.

Several embodiments of the semiconductor device 100 may increase the emission power per unit area over conventional LEDs. As shown in FIG. 1, conventional LEDs typically include planar N-type and/or P-type GaN materials 14 and 18. Such planar structures have limited interface area and thus can limit the number of quantum wells formed thereon to a footprint area of W×L (FIG. 3G). As a result, the emission output from the conventional LEDs may be limited. By forming three-dimensional wells 112 (FIG. 3B) in the first semiconductor material 106, the interfacial area for forming the active region 120 can be increased as described in the following formula:

$$\Delta A = P \times D \times \rho$$

where ΔA is the increase in interfacial area; P is perimeter of wells 112 (FIG. 3B); D (FIG. 3G) is depth of the wells 112; ρ is number of wells 112 in the footprint W×L (FIG. 3G). As a result, several embodiments of the semiconductor device 100 have higher MQW density per unit footprint area of the semiconductor device 100 than conventional LEDs to enable a higher emission power output.

Even though the wells 112 are shown in FIGS. 3B-3H as having hexagonal cross sections, in other embodiments, the wells 112 may also have pentagonal, circular, oval, rectilinear, square, triangular, and/or other suitable cross sections that are formed via dry etching and/or other suitable techniques. In further embodiments, the wells 112 may individually have a combination of cross sectional shapes that are formed via, e.g., multiple dry etching operations. In yet further embodiments, at least some of the wells 112 may have different geometric and/or other characteristics different from other wells 112.

From the foregoing, it will be appreciated that specific embodiments of the technology have been described herein for purposes of illustration, but that various modifications may be made without deviating from the disclosure. Many of the elements of one embodiment may be combined with other embodiments in addition to or in lieu of the elements of the other embodiments. Accordingly, the disclosure is not limited except as by the appended claims.

We claim:

1. A method for forming a light emitting diode, the method comprising:
    disposing a semiconductor material on a microelectronic substrate, the semiconductor material having a first surface facing toward the microelectronic substrate and a second surface facing away from the first surface;
    forming an array of wells extending into the semiconductor material from the second surface toward the first surface, with the individual wells including a sidewall and a base; and
    forming an active region in direct contact with the semiconductor material, the active region including a first portion on the second surface, a second portion on the sidewalls, and a third portion on the bases, wherein at least one of the first, second, and third portions has a thickness different than a thickness of another of the first, second, and third portions.

2. The method of claim 1 wherein forming the array of wells includes:
    disposing a mask material on the second surface;
    forming an array of apertures in the disposed mask material; and
    etching the semiconductor material via the apertures.

3. The method of claim 2 wherein etching the semiconductor material includes etching the semiconductor material using a first etching process followed by a second etching process, the first and second etching processes having different anisotropies.

4. The method of claim 2 wherein etching the semiconductor material includes etching the semiconductor material using:
    a wet etching process to cause the individual wells to have a hexagonal cross section in a plane parallel to the second surface; and
    a dry etching process to cause the individual wells to have a generally planar base.

5. The method of claim 2 wherein etching the semiconductor material includes etching the semiconductor material using a wet etching process to cause the individual wells to have:
    a hexagonal cross section in a plane parallel to the second surface; and
    a base with an inverted hexagonal pyramid shape.

6. The method of claim 2 wherein:
    etching the semiconductor material includes etching the semiconductor material to expose a crystal plane of the semiconductor material; and
    the method further comprises selecting at least one of (1) a spacing of the apertures, (2) a pattern of the apertures, (3) the crystal plane, (4) an exposed area of the crystal plane, and (5) a thickness of a portion of the active region adjacent to the crystal plane to control one or more emission characteristics of the light emitting diode.

7. The method of claim 2 wherein etching the semiconductor material includes etching the semiconductor material to cause the individual wells to have six sidewalls that are generally perpendicular to the second surface.

8. A method for forming a light emitting diode, the method comprising:
    disposing a first semiconductor material on a microelectronic substrate, the first semiconductor material having a first surface facing toward the microelectronic substrate and a second surface facing away from the first surface;
    forming an array of wells extending into the first semiconductor material from the second surface toward the first surface, with the individual wells having a hexagonal cross section in a plane parallel to the second surface;
    forming an active region in direct contact with the first semiconductor material; and
    forming a second semiconductor material in direct contact with the active region at a side of the active region opposite to a side of the active region in direct contact with the first semiconductor material, at least a portion of the second semiconductor material being located within the wells.

9. The method of claim 8 wherein forming the array of wells includes:
    disposing a mask material on the second surface;
    forming an array of apertures in the disposed mask material; and
    etching the semiconductor material via the apertures.

10. The method of claim 9 wherein:
    etching the semiconductor material includes etching the semiconductor material to expose a crystal plane of the semiconductor material; and
    the method further comprises selecting the crystal plane to control one or more emission characteristics of the light emitting diode.

11. The method of claim 9 wherein:
    etching the semiconductor material includes etching the semiconductor material to expose a crystal plane of the semiconductor material; and the method further comprises selecting an exposed area of the crystal plane to control one or more emission characteristics of the light emitting diode.

12. The method of claim 9 wherein:
etching the semiconductor material includes etching the semiconductor material to expose a crystal plane of the semiconductor material; and
the method further comprises selecting a thickness of a portion of the active region adjacent to the crystal plane to control one or more emission characteristics of the light emitting diode.

13. The method of claim 9, further comprising selecting a spacing of the apertures to control one or more emission characteristics of the light emitting diode.

14. The method of claim 9, further comprising selecting a pattern of the apertures to control one or more emission characteristics of the light emitting diode.

15. A method for forming a light emitting diode, the method comprising:
disposing a semiconductor material on a microelectronic substrate, the semiconductor material having a first surface facing toward the microelectronic substrate and a second surface facing away from the first surface;
disposing a mask material on the second surface;
forming an array of apertures in the disposed mask material;
forming an array of wells extending into the semiconductor material from the second surface toward the first surface by etching the semiconductor material using a first etching process followed by a second etching process, the first and second etching processes having different anisotropies; and
forming an active region in direct contact with the semiconductor material, at least a portion of the active region being located within the wells.

16. The method of claim 15 wherein forming the apertures includes forming the individual apertures to have a round cross section in a plane parallel to the second surface.

17. The method of claim 15 wherein forming the array of wells includes forming the individual wells to have a sidewall and a base with at least one of the sidewalls located at a crystal plane of the semiconductor material different than a crystal plane at which another of the sidewalls is located.

18. The method of claim 15 wherein:
forming the array of wells includes forming the individual wells to have a sidewall and a base; and
forming the active region includes forming the active region to have a first portion on the second surface, a second portion on the sidewalls, and a third portion on the bases.

* * * * *